United States Patent
Riel

(10) Patent No.: US 10,667,387 B2
(45) Date of Patent: May 26, 2020

(54) ACCURATE POSITIONING AND ALIGNMENT OF A COMPONENT DURING PROCESSES SUCH AS REFLOW SOLDERING

(71) Applicant: ams Sensors Singapore Pte. Ltd., Singapore (SG)

(72) Inventor: Peter Riel, Bach (CH)

(73) Assignee: ams Sensors Singapore Pte. Ltd., Singapore (SG)

(*) Notice: Subject to any disclaimer, the term of this patent is extended or adjusted under 35 U.S.C. 154(b) by 85 days.

(21) Appl. No.: 15/956,472

(22) Filed: Apr. 18, 2018

(65) Prior Publication Data

US 2018/0235080 A1  Aug. 16, 2018

Related U.S. Application Data

(62) Division of application No. 14/784,754, filed as application No. PCT/SG2014/000160 on Apr. 11, 2014, now abandoned.

(Continued)

(51) Int. Cl.
*B23K 31/02* (2006.01)
*H05K 1/02* (2006.01)
(Continued)

(52) U.S. Cl.
CPC .......... *H05K 1/0272* (2013.01); *B23K 1/008* (2013.01); *B23K 1/0016* (2013.01);
(Continued)

(58) Field of Classification Search
CPC .... H05K 1/0272; H05K 1/0306; H05K 1/181; H05K 3/3421; H05K 3/3494;
(Continued)

(56) References Cited

U.S. PATENT DOCUMENTS 4,951,240 A * 8/1990 Fukino ............... H05K 13/0069
29/744
5,534,442 A 7/1996 Parker et al.
(Continued)

FOREIGN PATENT DOCUMENTS

CA  2843918 A1 * 2/2013 ........... G01N 27/308
JP  4364333 B2 * 11/2009
(Continued)

OTHER PUBLICATIONS

Circuitnet, Ask the Experts—Comonent Shift During Reflow, http://www.circuitnet.com/experts/44477.shtml (downloaded Apr. 9, 2013) (3 pages).
(Continued)

*Primary Examiner* — Kiley S Stoner
(74) *Attorney, Agent, or Firm* — Michael Best & Friedrich LLP

(57) ABSTRACT

One or more channels are provided in the surface of a conductive layer of a PCB substrate in an area on which a component is to be placed. The channels can help reduce or prevent shifting of the component during reflow soldering through surface tension/capillary forces of the solder paste material in the channels. Such channels also can be used, for example, by an image processing system to facilitate accurate positioning and/or alignment of the component. The image processing system can use the location of the channels alone, or in combination with other features such as a solder mask or other alignment marks, to position and/or align the component with high accuracy.

7 Claims, 4 Drawing Sheets

Related U.S. Application Data

(60) Provisional application No. 61/811,971, filed on Apr. 15, 2013.

(51) Int. Cl.

| | |
|---|---|
| *B23K 1/00* | (2006.01) |
| *H05K 1/11* | (2006.01) |
| *H05K 3/30* | (2006.01) |
| *B23K 1/008* | (2006.01) |
| *B23K 35/02* | (2006.01) |
| *H05K 1/03* | (2006.01) |
| *H05K 1/18* | (2006.01) |
| *H05K 3/34* | (2006.01) |

(52) U.S. Cl.
CPC ......... *B23K 35/025* (2013.01); *H05K 1/0269* (2013.01); *H05K 1/0306* (2013.01); *H05K 1/111* (2013.01); *H05K 1/181* (2013.01); *H05K 3/303* (2013.01); *H05K 3/3421* (2013.01); *H05K 3/3494* (2013.01); *H05K 3/3431* (2013.01); *H05K 3/3452* (2013.01); *H05K 2201/09663* (2013.01); *H05K 2201/09745* (2013.01); *H05K 2201/09909* (2013.01); *H05K 2201/09918* (2013.01); *H05K 2201/10121* (2013.01); *H05K 2203/048* (2013.01); *H05K 2203/0445* (2013.01); *H05K 2203/0571* (2013.01); *H05K 2203/166* (2013.01); *Y02P 70/611* (2015.11); *Y02P 70/613* (2015.11)

(58) Field of Classification Search
CPC ...... H05K 3/303; H05K 1/0269; H05K 1/111; H05K 3/3431; H05K 3/3452; H05K 2201/09663; H05K 2201/09745; H05K 2201/09909; H05K 2201/09918; H05K 2201/10121; H05K 2203/0445; H05K 2203/048; H05K 2203/0571; H05K 2203/166; B23K 1/008; B23K 35/025; B23K 1/0016; B23K 3/0638; B23K 2101/36–42; Y02P 70/613; Y02P 70/611
USPC ...... 228/8–12, 102–103, 105, 179.1–180.22, 228/248.1–248.5, 165–169, 174
See application file for complete search history.

(56) References Cited

U.S. PATENT DOCUMENTS

| | | | | |
|---|---|---|---|---|
| 5,555,316 | A * | 9/1996 | Tsujikawa | G06T 7/0006 348/126 |
| 5,842,275 | A | 12/1998 | McMillan, II et al. | |
| 5,978,093 | A * | 11/1999 | Abrahamson | H05K 3/305 356/399 |
| 6,139,972 | A * | 10/2000 | Trott | B23K 3/0638 228/41 |
| 6,983,538 | B2 * | 1/2006 | Inoue | H05K 13/0469 228/8 |
| 7,042,098 | B2 | 5/2006 | Harun et al. | |
| 8,233,700 | B2 | 7/2012 | Mamiya | |
| 8,328,074 | B2 * | 12/2012 | Nagai | H05K 3/341 228/180.22 |
| 8,671,561 | B2 * | 3/2014 | Iida | H05K 3/3478 228/180.21 |
| 8,895,429 | B2 * | 11/2014 | Cok | G02B 6/138 257/48 |
| 2001/0027877 | A1 * | 10/2001 | Kuribayashi | H05K 13/0815 174/260 |
| 2002/0079219 | A1 * | 6/2002 | Zhao | B01L 3/502707 204/451 |
| 2002/0112348 | A1 * | 8/2002 | Inoue | H05K 3/3442 29/854 |
| 2002/0194729 | A1 * | 12/2002 | Kuribayashi | H05K 13/0815 29/834 |
| 2003/0096089 | A1 * | 5/2003 | Huang | H05K 1/111 428/209 |
| 2003/0141103 | A1 * | 7/2003 | Ng | H05K 1/111 174/250 |
| 2004/0031406 | A1 * | 2/2004 | Otake | B41F 33/0036 101/129 |
| 2004/0092141 | A1 * | 5/2004 | Salmon | H01L 21/6835 439/91 |
| 2005/0196996 | A1 * | 9/2005 | Yamasaki | G01B 11/14 439/329 |
| 2007/0220744 | A1 * | 9/2007 | Kitaoka | H05K 3/4614 29/846 |
| 2008/0236871 | A1 | 10/2008 | Schaefer et al. | |
| 2009/0211776 | A1 * | 8/2009 | Shimoyoshi | C03C 8/24 174/50.61 |
| 2009/0229879 | A1 * | 9/2009 | Udaka | H05K 1/113 174/535 |
| 2010/0002031 | A1 * | 1/2010 | Yun | H05K 3/125 347/9 |
| 2010/0229740 | A1 * | 9/2010 | Mitta | B41F 15/0881 101/129 |
| 2012/0193139 | A1 * | 8/2012 | Okuyama | H01R 4/028 174/551 |
| 2013/0065361 | A1 * | 3/2013 | Shen | H01L 23/4952 438/113 |
| 2013/0083489 | A1 * | 4/2013 | Dimauro | H05K 1/111 361/719 |
| 2013/0092721 | A1 * | 4/2013 | Trelford | H05K 1/112 228/256 |
| 2014/0251660 | A1 * | 9/2014 | Cok | H05K 3/1258 174/253 |
| 2014/0251671 | A1 * | 9/2014 | Trauernicht | H05K 3/1258 174/261 |
| 2014/0251672 | A1 * | 9/2014 | Cok | H05K 3/1258 174/261 |
| 2014/0251673 | A1 * | 9/2014 | Cok | H05K 3/1258 174/261 |
| 2015/0136837 | A1 * | 5/2015 | Maeda | H05K 13/08 228/102 |
| 2015/0181702 | A1 * | 6/2015 | Cok | H05K 1/097 174/253 |

FOREIGN PATENT DOCUMENTS

| | | | |
|---|---|---|---|
| JP | 2013000906 A | * | 1/2013 |
| JP | 2013000907 A | * | 1/2013 |
| TW | 200950971 A | | 12/2009 |

OTHER PUBLICATIONS

Circuitnet, Ask the Experts—Part Movement During Reflow, http://www.circuitnet.com/experts/45652.shtml (downloaded Apr. 9, 2013) (4 pages).
International Search Report dated Jun. 4, 2014 by the ISA/AU for Application No. PCT/SG2014/000160.

* cited by examiner

ACCURATE POSITIONING AND ALIGNMENT OF A COMPONENT DURING PROCESSES SUCH AS REFLOW SOLDERING

CROSS-REFERENCE TO RELATED APPLICATIONS

This application is a divisional of U.S. patent application Ser. No. 14/784,754, filed on Oct. 15, 2015, which is a National Stage of International Application No. PCT/SG2014/000160, filed on Apr. 11, 2014, which claims the benefit of U.S. Provisional Application No. 61/811,971, filed on Apr. 15, 2013. The entire contents of each of these prior applications is incorporated herein by reference in their entirety.

This disclosure relates to accurate positioning and alignment of a component during processes such as reflow soldering.

Surface mount technology (SMT) is an electronics assembly process in which electrical component leads are joined to a printed circuit board (PCB) by way of individual pad connections located on the board surface. In a typical SMT process, solder paste is applied to the PCB using a screen printer, and stencils designed with holes over individual pads control the solder application to the board. Electronic components are positioned on the PCB using placement equipment (e.g., pick-and-place machines), and component leads are placed in direct contact with the solder-pasted pads. The solder paste (i.e., a mixture of pre-alloyed solder powder and a flux-vehicle) is heated until it is melted (i.e., reflowed), and then it is cooled until the solder hardens and creates a permanent interconnection between the component leads and the PCB. This reflow process can be performed in a solder reflow oven. After reflow, the assembled circuit board can be cleaned, tested or assembled into a final product.

High-volume SMT lines use automated equipment to perform the SMT process steps. Such lines can produce a completed circuit board very quickly, with placement machines that can position up to tens of thousands of components per hour on the PCB.

High accuracy in placing and bonding the components on the PCB often is required and can be particularly important where the dimensions of the components are very small and where the components are placed near one another. However, position and alignment errors can occur as a result of errors in placement by the pick and place machines and/or shifting of the component during the reflow process. For example, because the solder becomes liquid during the reflow process, the components can move from the positions at which they were placed. If a component is shifted too far off its designated position, the device may not function properly (e.g., as a result of insufficient connection to the board) or the device may not be able to be manufactured further. Thus, techniques for reducing the occurrence of such errors are desirable.

SUMMARY

Various techniques are disclosed that can be used individually or in combination to improve positioning and/or alignment of components on a PCB and/or to reduce the amount of shift that occurs during reflow soldering or other processes.

As described in greater detail below, the techniques can include providing one or more channels in the surface of a conductive layer (e.g., a copper pad) of a PCB substrate in an area on which the component is to be placed. The channels can help reduce or prevent shifting of the component during reflow soldering through surface tension/capillary forces of the solder paste material in the channels. Such channels also can be used, for example, by an image processing system to facilitate accurate positioning and/or alignment of the component. The image processing system can use the location of the channels alone, or in combination with other features such as a solder mask or other alignment marks, to position and/or align the component with high accuracy.

For example, in one aspect, an apparatus includes a substrate that includes an insulating base layer and a conductive layer that has one or more channels in its surface. An electronic or optoelectronic component is bonded to the conductive layer by a solder material, such that the component is disposed at least partially over the one or more channels in the surface of the conductive layer.

Various implementations include one or more of the following features. For example, some of the solder can in the one or more channels and some of the solder can be on the surface of the conductive layer. In some cases, each of the one or more channels is a narrow groove in the surface of the conductive layer. In some implementations, each of the one or more channels extends substantially entirely through the thickness of the conductive layer.

According to another aspect, a method of bonding an electronic of optoelectronic component to a printed circuit board substrate includes depositing solder paste on a surface of a conductive layer of the printed circuit board substrate. The conductive layer includes one or more channels in its surface, and some of the solder paste is in the channels and some of the solder paste is on the surface of the conductive layer. The method includes placing the component on the conductive layer in contact with the solder paste such that the component is disposed at least partially over the one or more channels in the surface of the conductive layer. A reflow soldering process is performed to bond the component to the conductive layer.

In some implementations, the techniques described in this disclosure can help improve the positioning and/or alignment of components on a PCB substrate, particularly for manufacturing methods that involve bonding the component to the substrate using reflow soldering.

Other aspects, features and advantages will be readily apparent from the following detailed description, the accompanying drawing and the claims.

DETAILED DESCRIPTION

Figure 1:
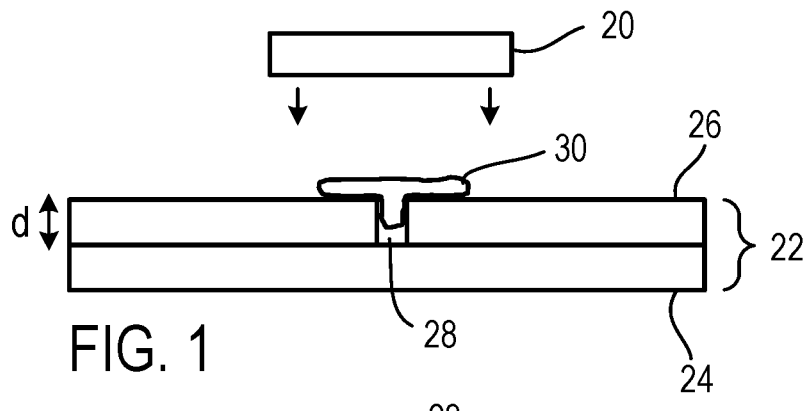
FIG. 1 is a cross-section of a component being placed on a first example of a PCB substrate.
Figure 2:
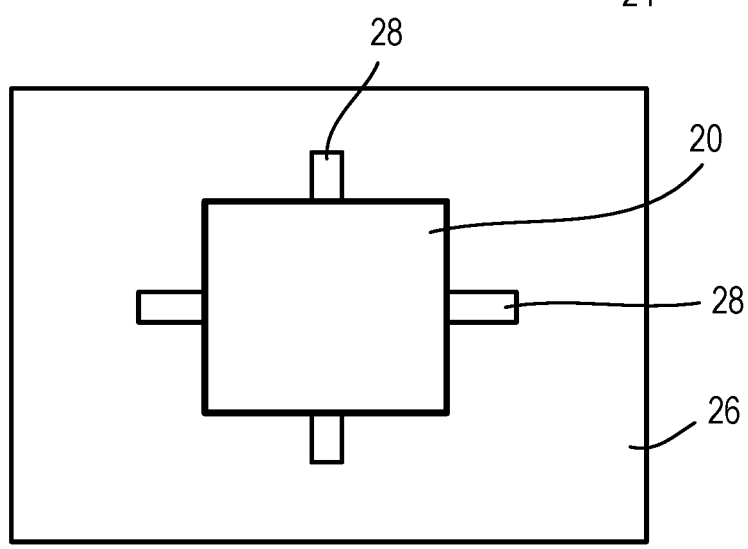
FIG. 2 is a top view showing the component on the PCB substrate.
Figure 3:
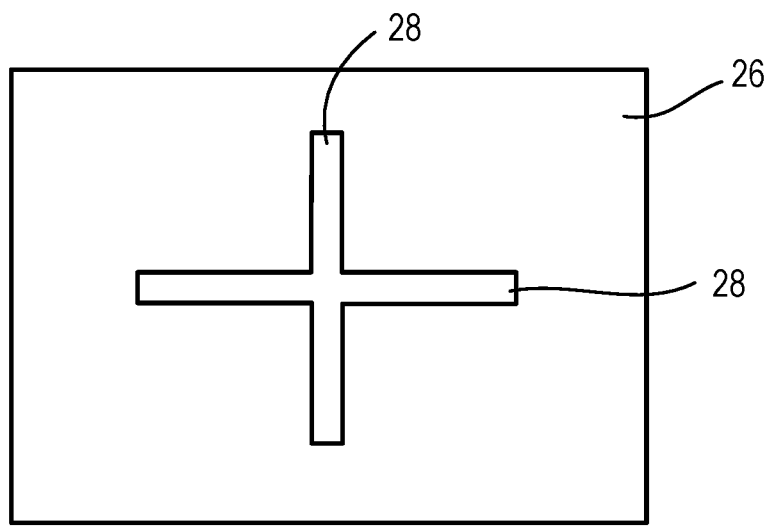
FIG. 3 is a top view of the PCB substrate.

As illustrated in FIGS. 1-3, a component 20 (e.g., an optoelectronic module or an integrated circuit) is mounted on a printed circuit board (PCB) substrate 22. Substrate 22 can include an insulating base layer 24 composed, for example, of a ceramic or fiberglass material, and a conductive layer 26 over the base layer. Conductive layer 26 can be formed, for example, as a copper or other metal pad that covers part, or all, of base layer 24. Component 20 can be bonded to the surface of conductive layer 26 by solder paste using a reflow soldering process.

The reflow solder can include a solder material (e.g., lead, tin, gold or other metal alloy) and flux. The flux serves as a flowing or purifying agent and can be, for example, a resin-based, organic or inorganic material. The flux allows the solder to flow easily between the component and the PCB substrate to which the component is to be bonded.

As shown in FIGS. 1-3, one or more channels 28 are provided in the upper surface of conductive layer 26 (i.e., the surface on which component 20 is mounted). Channels 28, which can have the shape of narrow grooves, can be formed, for example, by photolithography followed by etching of conductive layer 26. The depth ('d') of channels 28 depends on the implementation. In the illustrated example of FIG. 1, channels 28 are etched all the way through conductive layer 26, which in this example has a thickness of about sixty microns (μm). In other implementations, channels 28 may extend only partially through the thickness of conductive layer 26.

FIG. 3 shows a top view of conductive layer 26 after formation of channels 28 (and before placement of component 20 on conductive layer 26). Although the illustrated example shows a pair of channels 28 in a crisscross arrangement, a different number of channels can be provided (e.g., as few as one, or even more than two). Furthermore, the channels can be provided in an arrangement different from a crisscross pattern. Likewise, the channels need not be formed as straight, narrow grooves, but can, for example, have a serpentine or other shape. Preferably, channels 28 should be sufficiently deep so that during the reflow soldering process, the surface tension and capillary forces of the solder paste 30 in the channels significantly reduces or prevents shifting of component 20 placed on conductive layer 26.

Figure 4:
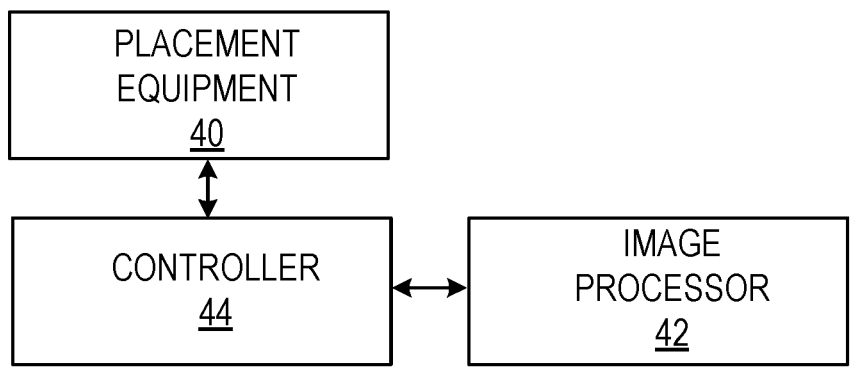
FIG. 4 is block diagram of a system for positioning and aligning the component on the substrate.

Channels 28 can serve one or more functions depending on the implementation. First, channels 28 can be used to facilitate positioning and/or alignment of component 20 when it is placed on conductive layer 26. As indicated by FIG. 4, component 20 can be positioned on substrate 22, for example, using placement equipment 40 such as a pick-and-place machine. An image processing system 42 then can use an image of channels 28 and component 20 to determine whether the component is positioned and aligned properly on substrate 22. For example, an image of component 20 and channels 28 can be compared to a previously-stored image or to previously-stored data. The results of the comparison can be provided to a controller 44, which then can control placement equipment 40 to adjust the position and/or alignment of component 20 on substrate 22 before performing the reflow soldering process. Image processing system 42 can include, for example, an image capturing (e.g., camera) module, memory to store images, and software for image processing. In some implementations, the software implements optical recognition of features in the captured image(s).

In addition to using channels 28 to facilitate positioning and/or alignment of component 20, channels 28 can help reduce or prevent shifting of the component's position, for example, during the reflow soldering process. As noted above, the solder becomes liquid during the reflow process, and this situation may allow the component to move from the position on the substrate at which the component was placed. Channels 28 can help reduce or prevent movement of component 20 during reflow soldering through surface tension and capillary forces of the solder paste in the channels.

Figure 5:
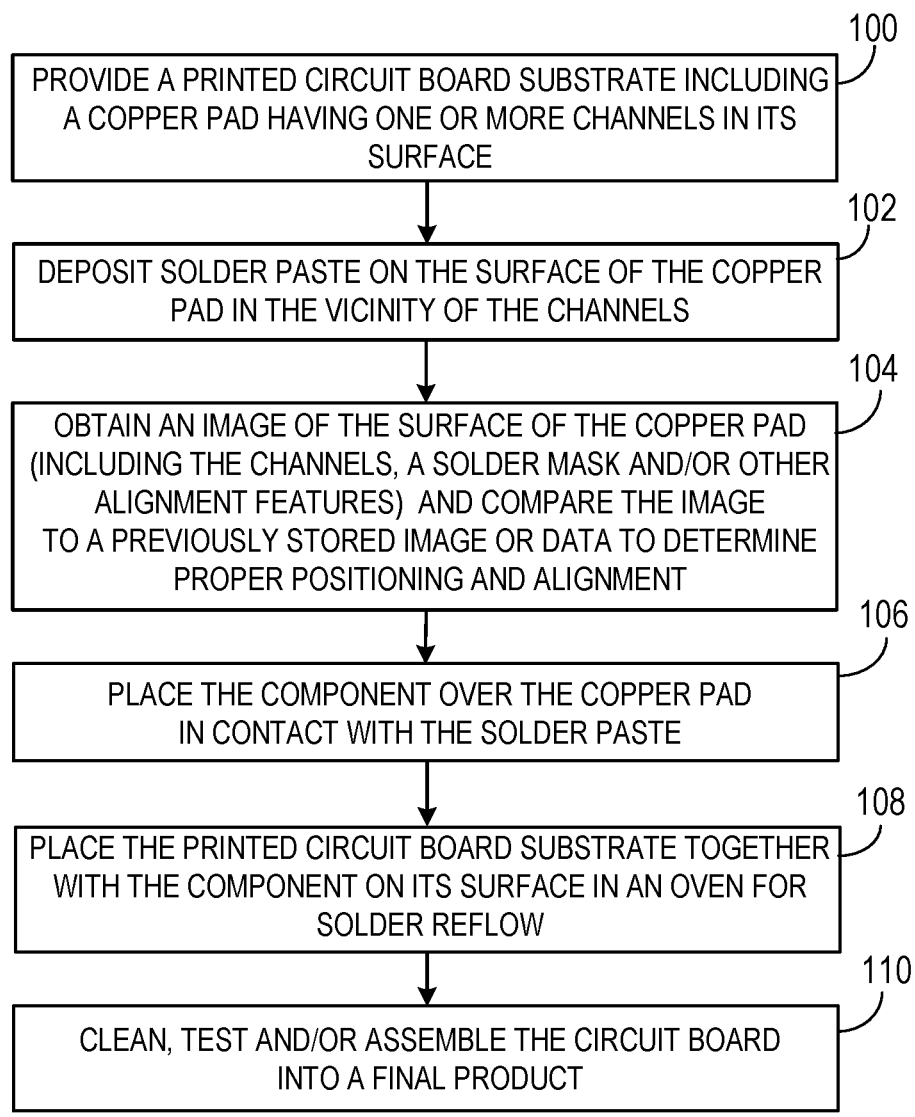
FIG. 5 is a flow chart showing an example of a method.

In an example process, as indicated by FIG. 5, a printed circuit board substrate including, for example, a copper pad having one or more channels in its surface is provided (block 100). Next, solder paste, which can include a mixture of solder and flux, is deposited on the surface of the copper pad in the vicinity of the channels, such that some of the solder paste flows into the channels and some of the solder paste remains on the surface of the copper pad (block 102). The image processing system then obtains an image of the surface of the copper pad as well as the channels and compares the image to a previously stored image or data so that proper x-y positioning and alignment of the component can be performed (block 104). Positioning and alignment information from the image processing system can be provided to the controller and to the pick-and-place machine. The component (e.g., an optoelectronic module or integrated circuit) then is placed, for example by the pick-and place machine, over the copper pad in contact with the solder paste based on the positioning and/alignment information (block 106). Next, the printed circuit board substrate together with the component on its surface is placed in an oven for solder reflow (block 108). The solder reflow process permanently bonds the component to the printed circuit board substrate. After reflow, the assembled circuit board can be cleaned, tested or assembled into a final product (block 110). An example of an application for the foregoing method is LED flashes for mobile devices such as mobile phones. The method can be used in other applications as well.

In some implementations, multiple components are positioned on the printed circuit board substrate 22 and form part of the assembled circuit board. The foregoing process can be performed with respect to each of the components. Furthermore, in some implementations, the process of FIG. 5 is partially or fully automated.

Figure 6:
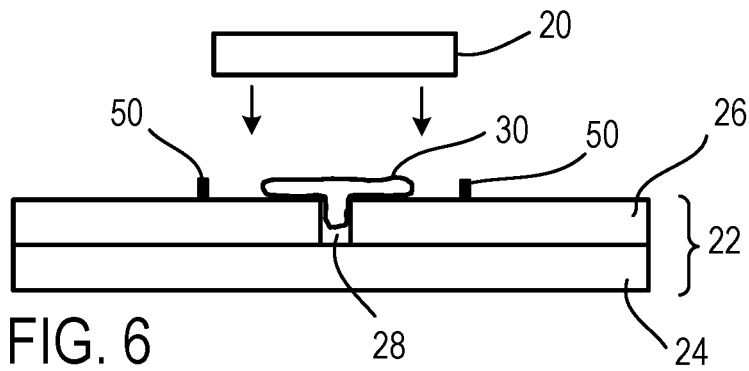
FIG. 6 is a cross-section of a component being placed on a second example of a PCB substrate.
Figure 7:
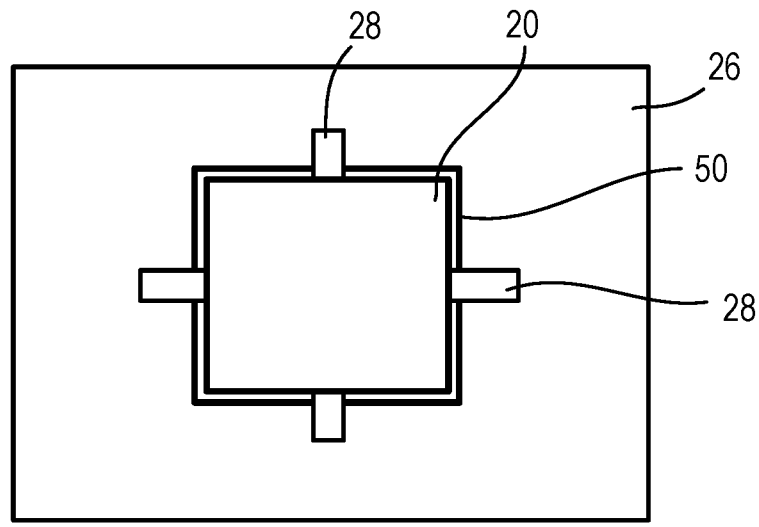
FIG. 7 is a top view showing the component on the PCB substrate of FIG. 6.
Figure 8:
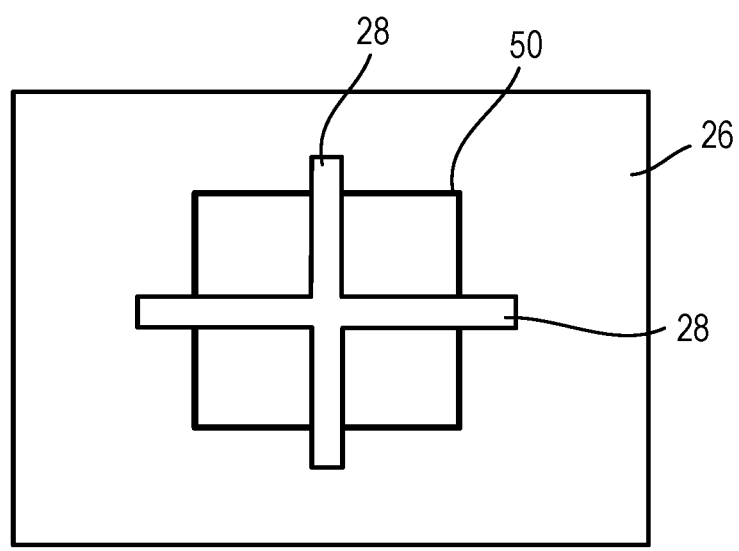
FIG. 8 is a top view of the PCB substrate of FIG. 6.

In some implementations, other features can be provided to facilitate assessing whether or not component 20 is positioned and/or aligned properly. For example, as shown in FIGS. 6-8, a solder mask 50 can be provided on conductive layer 26 so as to surround a pre-determined position for placement of component 20. Solder mask 50 can be composed, for example, of a polymer material and can be formed with high precision by various techniques (e.g., screen printing (using UV or thermal curing) or photo-printing (e.g., liquid or dry film using a photo-imageable solder mask material)). The dimensions of solder mask 50 can be slightly larger than the dimensions of component 20 such that the solder mask defines an area on the surface of substrate 22 within which the component is to be placed.

Solder mask 50 can protect against oxidation of the conductive layer 26 and can help prevent formation of solder bridges between closely spaced solder pads on the surface of substrate 22. In addition, in some implementations, solder mask 50 is used by image processing system 42 to determine proper positioning and alignment of component 20. As described above with respect to channels 28, image processing system 42 can compare an image of solder mask 50 to a previously-stored image or data so that proper x-y positioning and alignment of the component can be performed by the pick-and-place machine. Image processing system 42 can use an image of solder mask 50 for this purpose either alone or in combination with an image of channels 28. After placement of component 20 on conductive layer 26 by the pick-and-place machine, the solder reflow process can be performed for the printed circuit substrate together with the component(s) on its surface.

Figure 9:
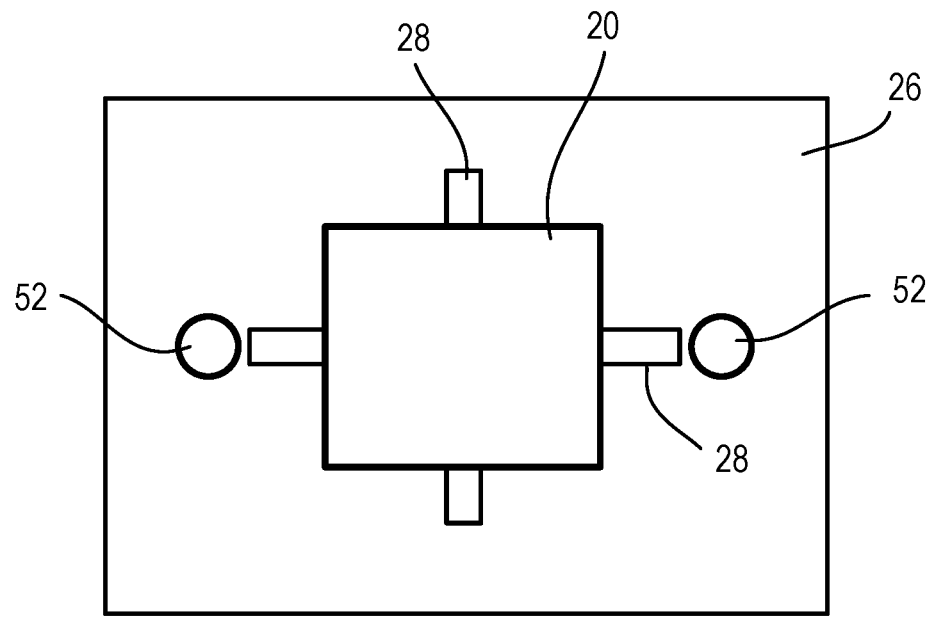
FIG. 9 is a top view showing a component on a third example of a PCB substrate.
Figure 10:
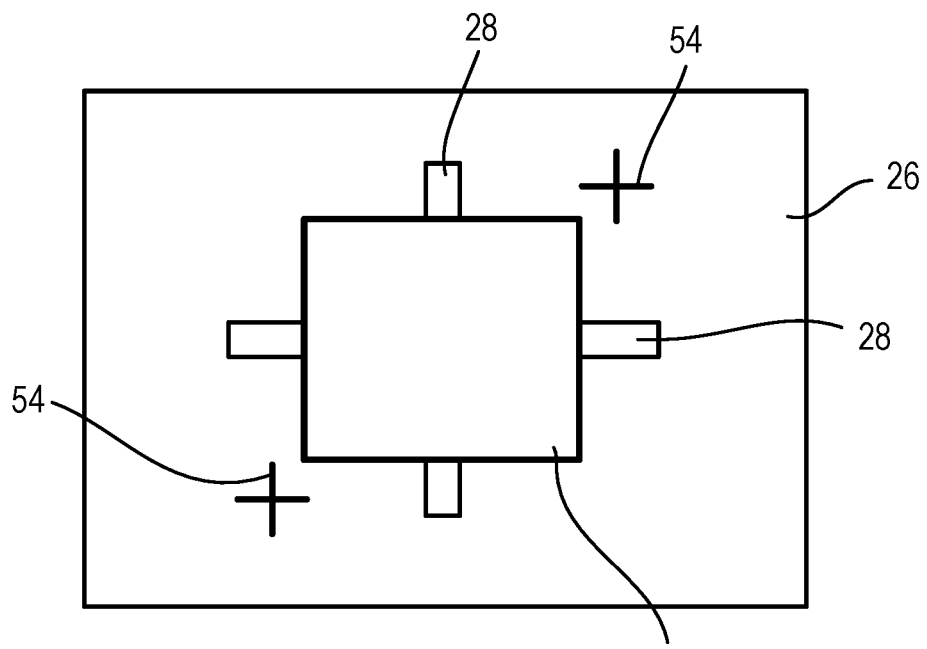
FIG. 10 is a top view showing a component on a fourth example of a PCB substrate.

In some implementations, additional alignment marks can be provided on the surface of conductive layer 26. A first example of such alignment marks 52 is illustrated in FIG. 9; a second example of alignment marks 54 is illustrated in FIG. 10. The alignment marks may have other shapes as well, and there may be a different number of alignment marks provided on the surface of conductive layer 26. Furthermore, the position of the alignment marks may differ from the locations illustrated in FIGS. 9 and 10. Alignment marks 52, 54 can be formed, for example, by a photolithographic process. The alignment marks can be used, for example, by image processing system 42 either alone or in combination with channels 28 and/or solder mask 50 to determine proper positioning and alignment of component 20. Thus, image processing system 42 can compare an image of alignment marks 52 (or 54) to a previously-stored image or data so that proper x-y positioning and alignment of the component can be performed by the pick-and-place machine. Image processing system 42 can use an image of alignment marks 52 (or 54) for this purpose either alone or in combination with an image of channels 28 and/or an image of solder mask 50. After placement of component 20 on conductive layer 26 by the pick-and-place machine, the solder reflow process then can be performed for the printed circuit substrate together with the component(s) on its surface.

The techniques described above can help improve the positioning and/or alignment of components on a PCB substrate, particularly for manufacturing methods that involve bonding the component to the substrate using reflow soldering. For example, in some implementations, the relative position error caused by shifting of the component during reflow soldering can be maintained at less than 20 µm and, in some cases, at significantly less than 20 µm (e.g., ≤5 µm misalignment relative to a neighboring component where the center-to-center distance between neighboring components is on the order of a few millimeters (e.g., 2-4 mm)).

Other implementations are within the scope of the claims.

What is claimed is:

1. A method of bonding an electronic or optoelectronic component to a printed circuit board substrate, the method comprising:
   depositing solder paste on a surface of a conductive layer of the printed circuit board substrate, wherein the conductive layer includes one or more channels in its surface and wherein some of the solder paste is in the channels and some of the solder paste is on the surface of the conductive layer;
   obtaining an image of the surface of the conductive layer including the one or more channels;
   comparing the image to a previously-stored image or data;
   using locations of the one or more channels to determine a positioning and/or alignment for the component based on the comparison of the image to the previously-stored image or data;
   placing the component on the conductive layer in contact with the solder paste based on the determined positioning and/or alignment, wherein the component is disposed at least partially over the one or more channels in the surface of the conductive layer; and
   performing a reflow soldering process to bond the component to the conductive layer.

2. The method of claim 1,
   wherein there is a solder mask on the surface of the conductive layer;
   wherein the image of the surface of the conductive layer includes the solder mask;
   and wherein the locations of the one or more channels and of the solder mask are used to determine the positioning and/or alignment for the component.

3. The method of claim 1,
   wherein there are one or more alignment features on the surface of the conductive layer, the alignment features being different from the channels;
   wherein the image of the surface of the conductive layer includes the one or more alignment features; and
   wherein the locations of the one or more channels and of the one or more alignment features are used to determine the positioning and/or alignment for the component.

4. The method of claim 1 wherein the one or more channels include a plurality of channels.

5. The method of claim 2 wherein the one or more channels include a plurality of channels.

6. The method of claim 3 wherein the one or more channels include a plurality of channels.

7. A method of bonding an electronic or optoelectronic component to a printed circuit board substrate, the method comprising:
   depositing solder paste on a surface of a conductive layer of the printed circuit board substrate, wherein the conductive layer includes one or more channels in its surface and wherein some of the solder paste is in the channels and some of the solder paste is on the surface of the conductive layer;
   positioning the component on the printed circuit board substrate;
   obtaining an image of the surface of the conductive layer including the one or more channels and the component;
   comparing the image to a previously-stored image or data;
   using locations of the one or more channels to determine whether the component is in a desired position and/or alignment on the substrate based on the comparison of the image to the previously-stored image or data;
   adjusting the positioning and/or alignment of the component on the conductive layer based on the determination, wherein the component is disposed in contact with the solder paste and at least partially over the one or more channels in the surface of the conductive layer; and
   performing a reflow soldering process to bond the component to the conductive layer.

* * * * *